US008873766B2

(12) United States Patent
Yamamoto et al.

(10) Patent No.: US 8,873,766 B2
(45) Date of Patent: Oct. 28, 2014

(54) SOUND SIGNAL PROCESSOR AND SOUND SIGNAL PROCESSING METHODS

(75) Inventors: Toshifumi Yamamoto, Tokyo (JP); Tadashi Amada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 318 days.

(21) Appl. No.: 13/345,220

(22) Filed: Jan. 6, 2012

(65) Prior Publication Data

US 2012/0275616 A1 Nov. 1, 2012

(30) Foreign Application Priority Data

Apr. 27, 2011 (JP) ................................ 2011-099567

(51) Int. Cl.
*H04R 29/00* (2006.01)
*H03G 9/00* (2006.01)

(52) U.S. Cl.
CPC .................................... *H04R 29/001* (2013.01)
USPC .................... 381/74; 381/58; 381/60; 381/98

(58) Field of Classification Search
CPC ........ H04R 3/04; H04R 29/00; H04R 29/001; H03G 5/16; H03G 5/165; H03G 5/025
USPC ............ 381/58, 60, 74, 91, 103, 122, 309, 98
See application file for complete search history.

(56) References Cited

U.S. PATENT DOCUMENTS 5,844,998 A * 12/1998 Nageno ......................... 381/371
7,715,568 B2 5/2010 Nakano
8,050,421 B2 11/2011 Fukuda et al.
8,081,769 B2 12/2011 Fukuda et al.
8,306,250 B2 11/2012 Watanabe
2003/0179891 A1 9/2003 Rabinowitz et al.
2005/0238176 A1 10/2005 Nakano (Continued)

FOREIGN PATENT DOCUMENTS

JP H 01-314097 12/1989
JP 04-010799 2/1992

(Continued)

OTHER PUBLICATIONS

Japanese Patent Application No. 2011-099567, Notice of Rejection, mailed Mar. 13, 2012, (with English Translation).

(Continued)

*Primary Examiner* — Vivian Chin
*Assistant Examiner* — William A Jerez Lora
(74) *Attorney, Agent, or Firm* — Blakely, Sokoloff, Taylor & Zafman LLP

(57) ABSTRACT

According to one embodiment, a sound signal processor includes: a connector; an input module; and a generator. The connector is connectable with an earphone. The input module receives and processes a plurality of sound signals corresponding to sound of a plurality of times output from the earphone, respectively. The generator generates, by using first data indicating a frequency characteristic of a first sound signal among the received and processed sound signals and second data indicating a frequency characteristic of a second sound signal among the received and processed sound signals, correction data correcting a frequency characteristic of the earphone to be a target frequency characteristic set as a target. The first data is used for a first frequency band lower than or equal to a reference. The second data is used for a second frequency band higher than the reference.

20 Claims, 10 Drawing Sheets

(56) References Cited

U.S. PATENT DOCUMENTS

| | | | | |
|---|---|---|---|---|
| 2006/0093159 | A1* | 5/2006 | Koh et al. | 381/98 |
| 2008/0118078 | A1 | 5/2008 | Asada et al. | |
| 2009/0208027 | A1 | 8/2009 | Fukuda et al. | |
| 2009/0296949 | A1 | 12/2009 | Iwata et al. | |
| 2010/0053210 | A1 | 3/2010 | Kon | |
| 2010/0177910 | A1* | 7/2010 | Watanabe | 381/94.1 |
| 2010/0278371 | A1* | 11/2010 | Hanada | 381/398 |
| 2010/0329481 | A1 | 12/2010 | Fukuda et al. | |
| 2011/0002471 | A1 | 1/2011 | Wihardja et al. | |
| 2011/0003615 | A1* | 1/2011 | Langereis | 455/556.1 |
| 2011/0164757 | A1 | 7/2011 | Sibbald et al. | |
| 2011/0222696 | A1 | 9/2011 | Balachandran et al. | |
| 2012/0219161 | A1 | 8/2012 | Amada et al. | |

FOREIGN PATENT DOCUMENTS

| | | |
|---|---|---|
| JP | H 09-185383 | 7/1997 |
| JP | 2005-309212 | 11/2005 |
| JP | 2005-318061 | 11/2005 |
| JP | 2007-043295 | 2/2007 |
| JP | 2007-240704 | 9/2007 |
| JP | 2008-131089 | 6/2008 |
| JP | 2008-268257 | 11/2008 |
| JP | 2009-194769 | 8/2009 |
| JP | 2009-284097 | 12/2009 |
| JP | 2010-056589 | 3/2010 |
| JP | 2010-081071 | 4/2010 |
| JP | 2010-226332 | 10/2010 |
| JP | 2011-015080 | 1/2011 |
| WO | WO 2009-125567 | 10/2009 |
| WO | WO 2009/125567 | 10/2009 |

OTHER PUBLICATIONS

Japanese Patent Application No. 2011-0422625, First Office Action, mailed Jan. 31, 2012, (with English Translation).

Japanese Patent Application No. 2012-067588, First Office Action, mailed Apr. 16, 2013, (with English Translation).

U.S. Appl. No. 13/294,479, Non-Final Office Action, mailed Dec. 31, 2013.

* cited by examiner

SOUND SIGNAL PROCESSOR AND SOUND SIGNAL PROCESSING METHODS

CROSS-REFERENCE TO RELATED APPLICATIONS

This application is based upon and claims the benefit of priority from Japanese Patent Application No. 2011-099567, filed on Apr. 27, 2011, the entire contents of which are incorporated herein by reference.

FIELD

Embodiments described herein relate generally to a sound signal processor and a sound signal processing method.

BACKGROUND

When a user personally listens to reproduced music and voice, he/she often uses headphones such as earphones and stereo phones. Frequency characteristics of the sound output from headphones differ for different products, thereby the sound output from the headphones do not always have a user desired frequency characteristic.

Therefore, there are demands for the sound output from the headphones to have a user desired frequency characteristic.

Conventionally, it is difficult to appropriately correct the frequency characteristic of the earphone at when the user uses the earphone, because there is provided no means to objectively measure the correct frequency characteristic. On the other hand, when an equalizer is used for manual adjustment of the frequency characteristic, a user needs to subjectively adjust the equalizer while listening to musical sound. In this case, the user often repeats the adjustment by trial and error because the subjective adjustment is influenced by, for example, a sound source and the user's mood. Thus, it is difficult to properly correct the sound from the earphone. Furthermore, as a reproducible measurement technique, there is known a technique using a jig of a special type, but this requires the jig for every measurement.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, a sound signal processor comprises: a connector; an input module; and a generator. The connector is configured to be connectable with an earphone. The input module is configured to receive and process a plurality of sound signals corresponding to sound of a plurality of times output from the earphone, respectively. The generator is configured to generate, by using first data indicating a frequency characteristic of a first sound signal among the received and processed sound signals and second data indicating a frequency characteristic of a second sound signal among the received and processed sound signals, correction data correcting a frequency characteristic of the earphone to be a target frequency characteristic set as a target. The first data is used for a first frequency band lower than or equal to a reference. The second data is used for a second frequency band higher than the reference.

In following embodiments, a sound signal processor is applied to a personal computer (PC).

Figure 1:
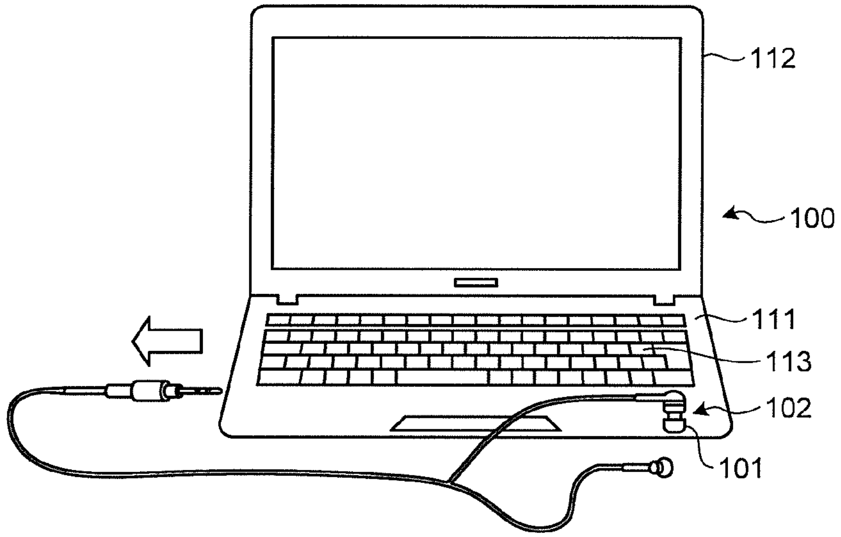
FIG. 1 is an exemplary external view of a personal computer (PC) with a display unit being opened, according to a first embodiment.

FIG. 1 is a diagram illustrating an external view of a PC 100 with a display unit being open, according to a first embodiment. The PC 100 illustrated in FIG. 1 comprises a computer body 111 and a display unit 112.

The computer body 111 has a thin box shape, and a keyboard 113 on a top surface thereof. The computer body 111 comprises a microphone. The computer body 111 has a microphone hole 102 so that the microphone can efficiently collect sound. The computer body 111 comprises an output terminal for headphones (also referred to as a headphone terminal) on a side surface thereof. The computer body 111 can be connected to an earphone 101 through the headphone terminal. The earphone 101 is one of a pair of earphones.

The plug of the earphones (the earphone 101) is inserted into the headphone terminal of the PC 100. The PC 100 transmits a measurement signal from the earphone 101 through the headphone terminal. The PC 100 can measure a characteristic of the earphone 101 by collecting the signal with the microphone.

Figure 2:
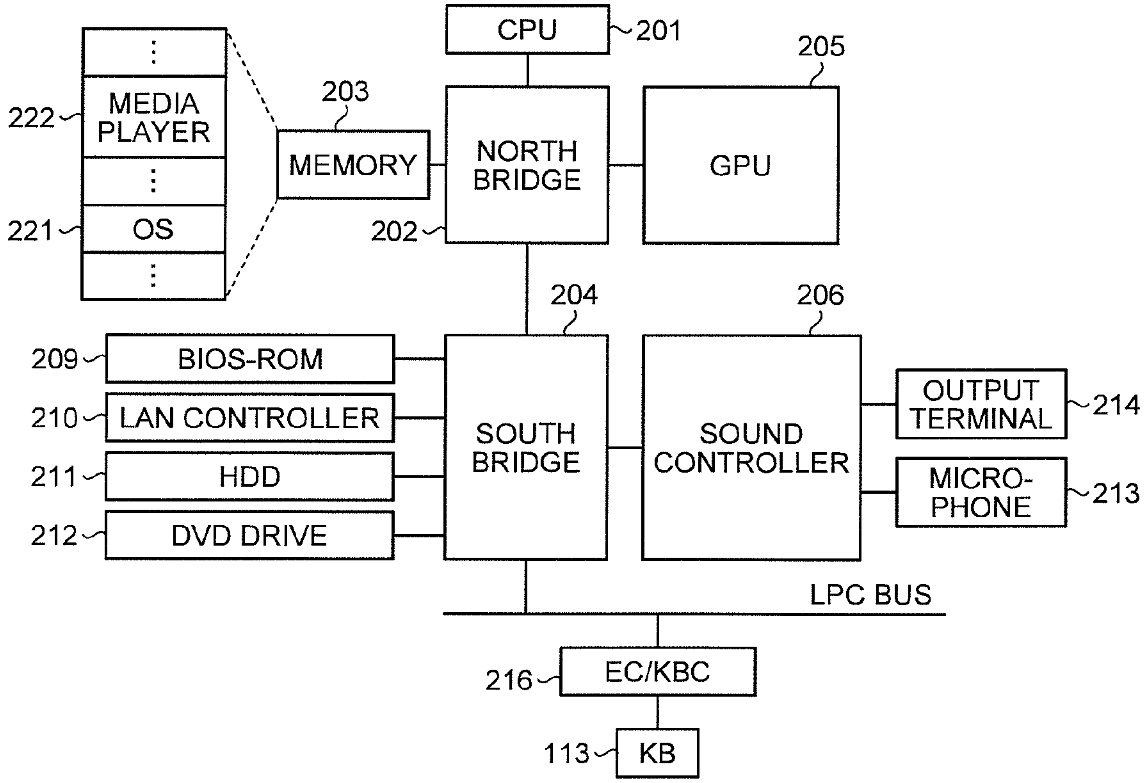
FIG. 2 is an exemplary block diagram of a hardware configuration of the PC in the first embodiment.

FIG. 2 is a block diagram of a hardware configuration of the PC 100. As illustrated in FIG. 2, the PC 100 comprises a central processing unit (CPU) 201, a north bridge 202, a main memory 203, a south bridge 204, a graphics processing unit (GPU) 205, a sound controller 206, a basic input output system (BIOS)-read only memory (ROM) 209, a local area network (LAN) controller 210, a hard disk drive (HDD) 211, a digital versatile disc (DVD) drive 212, and an embedded controller/keyboard controller (EC/KBC) integrated circuit (IC) 216.

The CPU 201 is a processor that controls operation of the PC 100. The CPU 201 executes an operating system (OS) 221, and various application programs such as a media player 222, which are loaded from the HDD 211 to the main memory 203. The media player 222 is application software to reproduce moving picture (video) files and audio files. The CPU 201 executes a BIOS stored in the BIOS-ROM 209. The BIOS is a program for hardware control.

The north bridge 202 is a bridging device connecting a local bus of the CPU 201 with the south bridge 204. The north bridge 202 comprises a memory controller to control access to the main memory 203. The north bridge 202 has a function to communicate with the GPU 205 through a serial bus compliant with the peripheral components interconnection (PCI) EXPRESS standard, for example.

The GPU 205 is a display controller controlling a liquid crystal display panel used as a display monitor of the PC 100. The GPU 205 uses a video random access memory (VRAM), which is not illustrated, as a working memory. Video signal generated by the GPU 205 is transmitted to the liquid crystal display panel.

The south bridge 204 controls devices connected to each other through the bus. The south bridge 204 comprises a serial advanced technology attachment (SATA) controller to control the HDD 211 and the DVD drive 212. The south bridge 204 has a function to communicate with the sound controller 206. The sound controller 206 is a sound source device, and comprises circuits such as a digital-to-analog (D/A) converter converting a digital signal into an analog electrical signal, and an amplifier amplifying electrical signals. The sound controller 206 further comprises a circuit, such as an analog-to-digital (A/D) converter to convert an analog electrical signal received from a microphone 213 into a digital signal.

The EC/KBC IC 216 is a one-chip microcomputer in which an embedded controller for power control and a keyboard controller for controlling the keyboard (KB) 113 are integrated.

Figure 3:
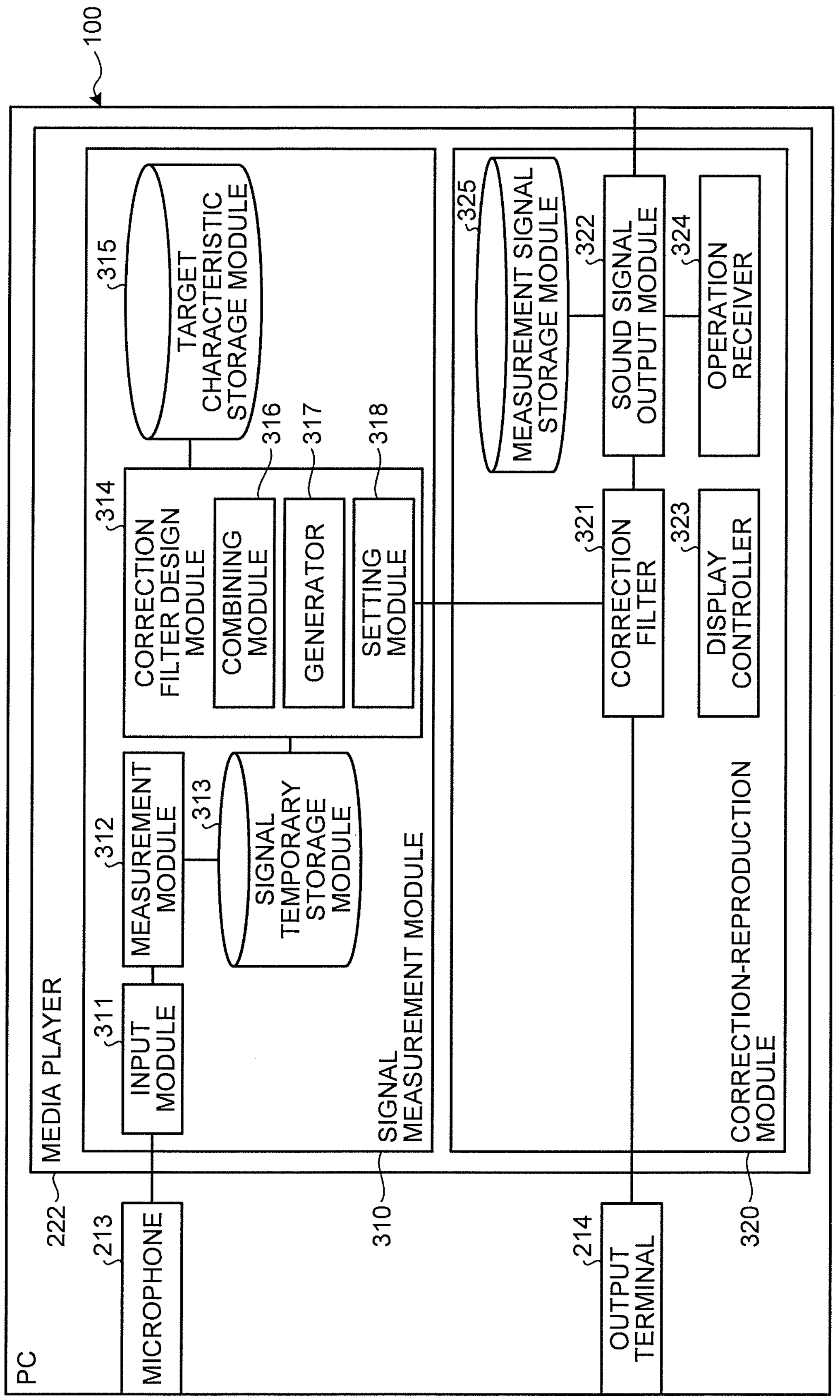
FIG. 3 is an exemplary block diagram of a software configuration of a media player of the PC in the first embodiment.

FIG. 3 is a block diagram of a software configuration of the media player 222 of the PC 100 according to the first embodiment. As illustrated in FIG. 3, the media player 222 comprises a signal measurement module 310 and a correction-reproduction module 320. An output terminal 214 is connectable to the earphone 101. The signal measurement module 310 measures a frequency characteristic of the earphone 101, and designs a correction filter. The correction-reproduction module 320 corrects an audio signal by using the designed correction filter. The corrected audio signal is output from the earphone 101 through the output terminal 214.

Figure 4:
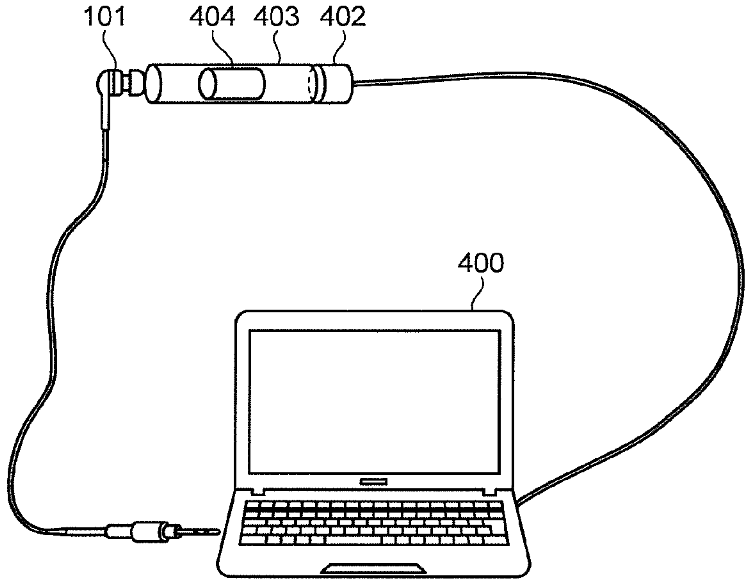
FIG. 4 is an exemplary diagram illustrating a way of measuring characteristics of earphones by the PC with a jig.

There is a technique for measuring a frequency characteristic of an earphone with good reproducibility by using a jig. FIG. 4 is a diagram illustrating an example of a way of measuring the frequency characteristic of an earphone by using a PC 400 and a jig. The jig illustrated in FIG. 4 comprises a tube 403, a microphone 402, and a sound absorbing member 404. The tube 403 is made of resin of a tubular shape, for example. Furthermore, the tube 403 is formed in a straight shape such as a shape of a water pipe and a gas pipe, and has a capacity that is nearly equal to a capacity of an external auditory canal of a user, for example. The microphone 402 can be attached to the tube 403. The sound absorbing member 404 is disposed inside the tube 403 and at nearly the center of tube 403, at which the largest air vibration occurs, so as to suppress an influence of standing waves.

The earphone 101 to be measured is attached to the jig, and then the PC 400 acquires data from the earphone 101. In data acquired by a measurement method using the jig, resonance produced in an external auditory canal of a user is excluded from the characteristics of sound when the user practically listens. Therefore, a frequency characteristic of a high-quality sound earphone and a frequency characteristic of an earphone that a user uses (hereinafter, also referred to as user earphone) are acquired by using a common measurement system using the jig. When the user uses the earphone, sound quality of the user's earphone can be approximated to sound quality of the high-quality sound earphone by setting an equalizer in such a manner that the frequency characteristic of the user's earphone is approximated to that of the high-quality sound earphone.

Figure 5:
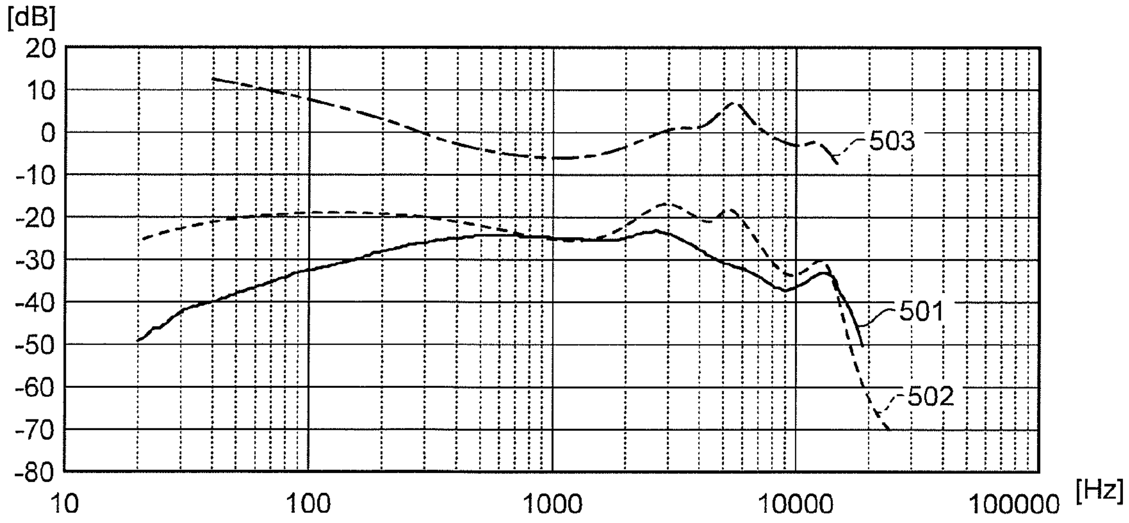
FIG. 5 is an exemplary graph of measurement data measured on a high-quality sound earphone and a user earphone by using the jig.

FIG. 5 is a graph illustrating an example of data of frequency characteristics measured by the PC 400 on a plurality of earphones by using the jig. Measurement data 501 illustrated in FIG. 5 represents a frequency characteristic of the user earphone. Measurement data 502 represents a frequency characteristic of a high-quality sound earphone. The PC 400 generates difference data 503 in which an offset is added to a difference between the measurement data 502 of the high-quality sound earphone and the measurement data 501 of the user's earphone. The PC 400 can approximate sound quality of the user's earphone to sound quality of the high-quality sound earphone by using an equalizer having a characteristic fitting the characteristic curve of the difference data 503.

When employing the measurement technique using the jig, a user needs to purchase the jig, and measure the frequency characteristic of the earphone by using the jig so as to set desired sound quality, thereby incurring costs. In the first embodiment, the frequency characteristic of the earphone is measured without using the jig. The inventors have studied a method to measure the frequency characteristic of an earphone with good reproducibility without using a jig, and have found, based on experiments, that it is effective for achieving the good reproducible measurement method by combining measurement results measured in different conditions a plurality of times. The PC 100 according to the first embodiment measures the frequency characteristic of the earphone in different conditions a plurality of times, and combines the measurement results so that the frequency characteristic of the earphone is determined without using a jig. In the following, conditions of an earphone during the measurement of the frequency characteristic are described.

Figure 6:
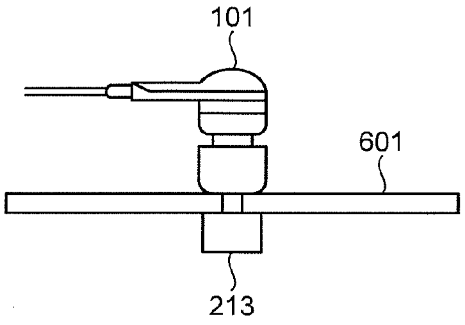
FIG. 6 is an exemplary diagram illustrating an ear chip of the earphone which is in close contact with a microphone, in the first embodiment.

FIG. 6 is a diagram illustrating a state in which an ear chip of the earphone 101 is in close contact with the microphone 213. As illustrated in FIG. 6, the PC 100 comprises the microphone 213 inside a cabinet 601. A user brings the ear chip of the earphone 101 in close contact with an opening for the microphone 213 to collect sound such that the ear chip makes close contact with the cabinet 601. The PC 100 outputs a measurement signal from the earphone 101 while the ear chip of the earphone 101 is brought in close contact with the cabinet 601. The PC 100 collects the output measurement signal through the microphone 213. In this way, the PC 100 acquires the first measurement data indicating the frequency characteristic of the earphone 101 while the earphone 101 and the microphone 213 are brought close in contact with each other with the cabinet 601 interposed therebetween. This state is also referred to as a state in which the earphone 101 and the microphone 213 are made close contact with each other, or a close contact state. The first measurement data means data measured in the state in which the earphone 101 and the microphone 213 are brought close in contact with each other.

Figure 7:
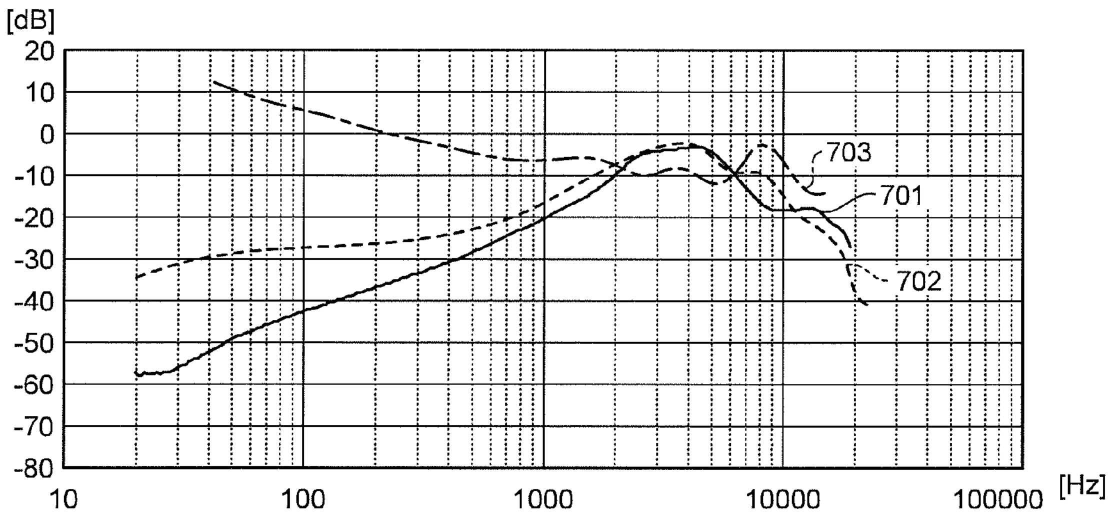
FIG. 7 is an exemplary graph of first measurement data measured when the high-quality sound earphone and the user earphone are each brought close in contact with the microphone, in the first embodiment.

FIG. 7 is a graph illustrating an example of the first measurement data measured on a high-quality sound earphone that is a target of correction, and the earphone 101 that a user uses while each earphone is in the close contact state. The example of FIG. 7 illustrates first measurement data 701 of the earphone 101 that the user uses, first measurement data 702 of the high-quality sound earphone that is the target of correction, and difference data 703 in which an offset whose average level is zero dB is added to a difference between the first measurement data 701 and the first measurement data 702. With the comparison between the difference data 503 measured by using the jig and the difference data 703 of FIG. 7, it can be seen that both profiles are approximately similar to each other in a frequency band of equal to or lower than about 800 Hz while both profiles are different from each other in a frequency band of higher than about 800 Hz. It is confirmed that a reliable frequency characteristic can be obtained in a frequency band of equal to or lower than about 800 Hz when the frequency characteristic is measured in the state in which the earphone 101 and the microphone 213 are brought close in contact with each other.

Figure 8:
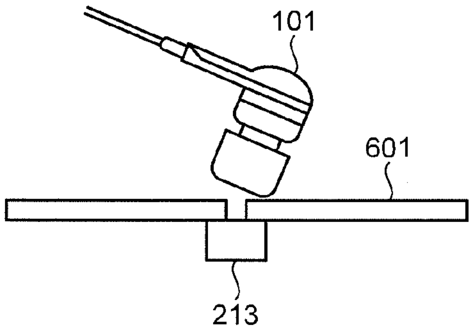
FIG. 8 is an exemplary diagram illustrating a gap provided between the ear chip of the earphone and the microphone, in the first embodiment.

FIG. 8 is a diagram illustrating a state in which a gap is provided between the ear chip of the earphone 101 and the microphone 213. This state is also referred to as a gap state. The gap state illustrated in FIG. 8 differs from the close contact state illustrated in FIG. 6 in that a gap (open space) is provided between the microphone 213 and the earphone 101 because a user puts the earphone 101 against the cabinet 601 so that the earphone 101 is slanted relative to the cabinet 601. The PC 100 outputs a measurement signal from the earphone 101 in the state in which the gap is provided between the ear chip of the earphone 101 and the cabinet 601 as illustrated in FIG. 8. The PC 100 collects the output measurement signal through the microphone 213. In this way, the PC 100 acquires second measurement data indicating the frequency characteristic of the earphone 101 in the state in which the gap is provided between the earphone 101 and the microphone 213. The second measurement data means data measured in the state in which a gap is provided between the earphone 101 and the microphone 213. Any signal can be used as a measurement signal as long as the frequency characteristic of an earphone can be measured. Examples of the signal comprise a white noise, a pink noise, and a time stretched pulse (TSP) signal.

Figure 9:
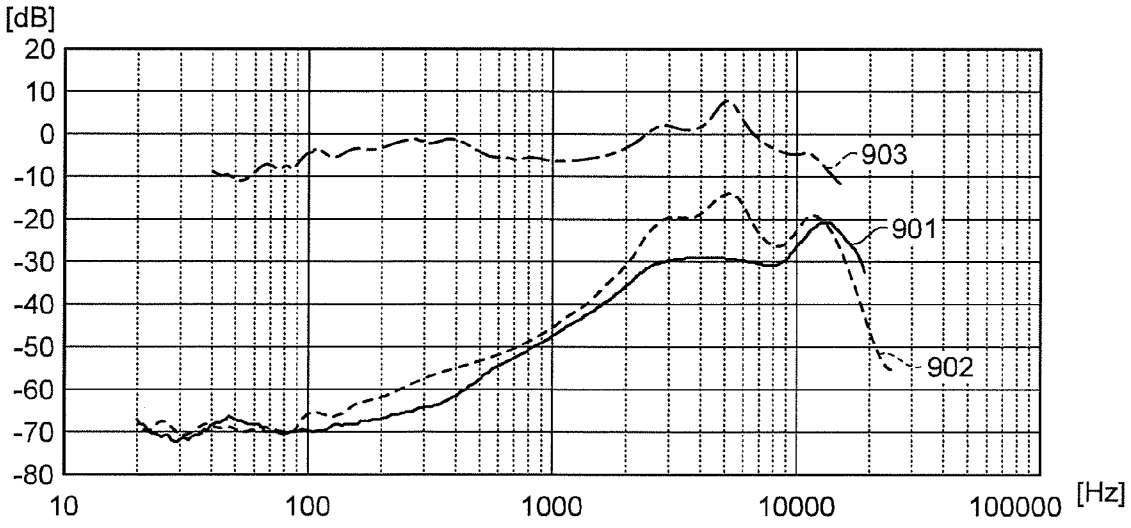
FIG. 9 is an exemplary graph of second measurement data measured when the gap is provided between the microphone and each of the high-quality sound earphone and the user earphone, in the first embodiment.

FIG. 9 is a graph illustrating an example of the second measurement data measured on a high-quality sound earphone that is a target of correction, and the earphone 101 that a user uses while each earphone is in the gap state. The example of FIG. 9 illustrates second measurement data 901 of the earphone 101 that the user uses, second measurement data 902 of the high-quality sound earphone that is the target of correction, and difference data 903 in which an offset is added to a difference between the second measurement data 901 and the second measurement data 902. The second measurement data 901 and the second measurement data 902 are largely attenuated in a low frequency band as illustrated in FIG. 9. With the comparison between the difference data 503 of FIG. 5, which illustrates data when the jig is used, and the difference data 903 of FIG. 9, it can be seen that both profiles are different from each other in a frequency band of equal to or lower than about 800 Hz. It also can be seen that both profiles are approximately similar to each other in a frequency band of higher than about 800 Hz. It is confirmed that a reliable frequency characteristic can be obtained in a frequency band higher than about 800 Hz when the frequency characteristic is measured in the state in which a gap is provided between the earphone 101 and the microphone 213.

In view of the above data, the PC 100 according to the embodiment can appropriately correct the frequency characteristic of an earphone as follows: the frequency characteristic of the earphone is measured in the close contact state and the gap state, and designs a correction filter by combining those frequency characteristics.

Referring back to FIG. 3, a configuration of the media player 222 that designs and utilizes a correction filter in the PC 100 is described.

The correction-reproduction module 320 of the media player 222 comprises a correction filter 321, a sound signal output module 322, a measurement signal storage module 325, a display controller 323, and an operation receiver 324. The correction-reproduction module 320 corrects and outputs sound. The correct sound is heard as sound similar to that output from an ideal earphone when heard by the earphone used for the measurement. For example, a user can enjoy music with high-quality sound when reproducing the music by using the earphone.

The measurement signal storage module 325 stores therein a sound signal used for measuring the frequency characteristic of the earphone 101.

The sound signal output module 322 outputs a sound signal from the earphone 101 connected to the output terminal 214 through the correction filter 321. The sound signal output module 322 outputs a sound signal stored in the sound signal output module 322 if needed. The sound signal output by the sound signal output module 322 is not limited to the measurement sound signal. For example, a sound signal received from an outside and a sound signal stored in the HDD 211 of the PC 100 may be applicable. When a measurement signal is output, the correction filter 321 is set so as not to perform correction.

The correction filter 321 corrects a sound signal received from the sound signal output module 322 by using the correction filter (correction parameters) 321 set by the signal measurement module 310. The correction parameters are described later. An example of the correction filter 321 is a typical parametric equalizer.

The display controller 323 displays a display allowing a user to start measuring the frequency characteristic of the earphone 101 when measuring data. The operation receiver 324 receives a selection of the start of measurement from the user.

Figure 10:
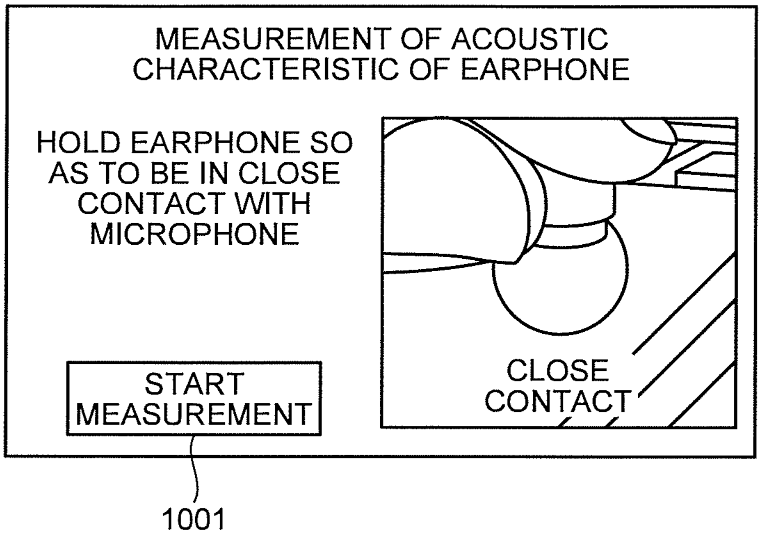
FIG. 10 is an exemplary diagram illustrating a screen displayed by a display controller so as to urge the user to bring the earphone and the microphone close in contact with each other, in the first embodiment.

FIG. 10 is a diagram illustrating an example of a screen displayed to urge the user to bring the earphone 101 and the microphone 213 to be in the close contact state. With the display displayed by the display controller 323 as illustrated in FIG. 10 to urge the user to make the close contact state, the user holds the earphone 101 such that the earphone 101 is brought close in contact with the microphone 213. While they are in the close contact state, upon receiving a selection of a measurement start button 1001 from the user, the operation receiver 324 instructs the sound signal output module 322 to output a sound signal. Accordingly, the measurement of the frequency characteristic starts while the earphone 101 and the microphone 213 are brought close in contact with each other.

Figure 11:
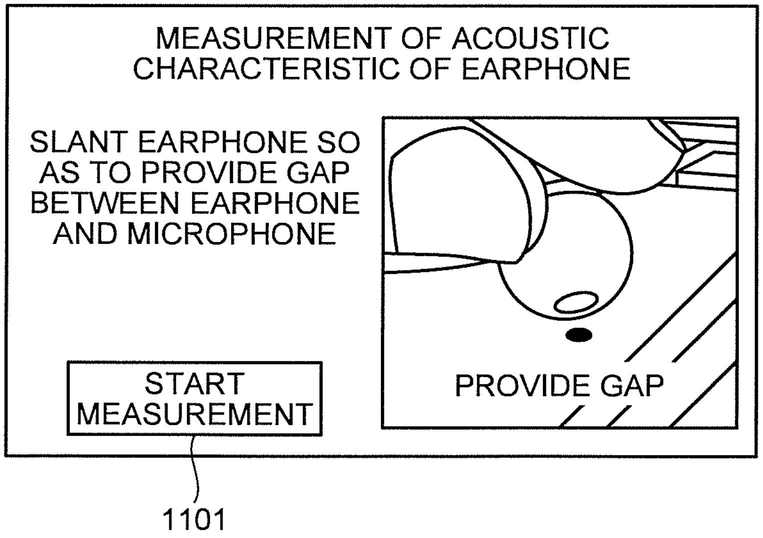
FIG. 11 is an exemplary diagram illustrating a screen displayed by the display controller so as to urge the user to provide a gap between the earphone and the microphone, in the first embodiment.

FIG. 11 is a diagram illustrating an example of a screen displayed to urge the user to provide a gap between the earphone 101 and the microphone 213. With the display displayed by the display controller 323 as illustrated in FIG. 11 to urge the user to provide a gap (open space), the user holds the earphone 101 such that the gap is provided between the earphone 101 and the microphone 213. While they are in the gap state, upon receiving a selection of a measurement start button 1101 from the user, the operation receiver 324 instructs the sound signal output module 322 to output a sound signal. Accordingly, the measurement of the frequency characteristic starts while the gap is provided between the earphone 101 and the microphone 213.

The signal measurement module 310 of the media player 222 comprises an input module 311, a measurement module 312, a signal temporary storage module 313, a correction filter design module 314, and a target characteristic storage module 315.

The target characteristic storage module 315 stores therein the frequency characteristic of a high-quality sound earphone that is preliminarily provided as a reference. The frequency characteristic stored in the target characteristic storage module 315 is not limited to the frequency characteristic of the high-quality sound earphone. Any frequency characteristic may be applicable as long as it is used as a target frequency characteristic of an earphone that a user uses. For example, a frequency characteristic modified in accordance with user's preference may be stored. In addition, the number of stored frequency characteristics is not limited to one. A plurality of frequency characteristics that a user regards as ideal may be stored, and the user may select a desired frequency characteristic from them.

The microphone 213 converts input sound into an electrical signal.

The input module 311 receives a sound signal through the microphone 213, and processes the sound signal. The input module 311 converts an electrical signal representing sound into a digital signal by using the A/D converter, and outputs the digital signal to the measurement module 312. When a measurement sound signal is output from the earphone 101 for a plurality of times, the input module 311 receives and processes the sound signals corresponding to the sound of the plurality of times, respectively.

The measurement module 312 measures a sound pressure level of sound based on a digital sound signal received from the input module 311. The measurement module 312 generates measurement data indicating a frequency characteristic of the sound signal based on the measured sound pressure level. The measurement module 312 stores the generated measurement data indicating the frequency characteristic in the signal temporary storage module 313.

The signal temporary storage module 313 temporarily stores therein the measurement data indicating the frequency characteristic of the sound signal, which is stored by the measurement module 312, until the correction filter design module 314 reads the measurement data.

The correction filter design module 314 comprises a combining module 316, a generator 317, and a setting module 318. The correction filter design module 314 designs a correction filter in such a manner that the frequency characteristic of the user's earphone is approximated to the frequency characteristic of the high-quality sound earphone stored in the target characteristic storage module 315 as the target characteristic.

In the embodiment, it is advantageous that an equalizer is designed by using the first measurement data in a frequency band of equal to or lower than about 800 Hz as illustrated in FIG. 7, and the second measurement data in a frequency band of greater than about 800 Hz as illustrated in FIG. 9. Therefore, in the embodiment, a technique is employed in which the first measurement data and the second measurement data are combined, as an example of a technique generating the equalizer. The technique generating the equalizer is not limited to the technique combining measurement data. Any technique may be employed as long as the first measurement data is used in a frequency band of equal to or lower than about 800 Hz, while the second measurement data is used in a frequency band of higher than about 800 Hz. For example, a low frequency band of the difference data 703 and a high frequency band of the difference data 903 may be combined.

The combining module 316 combines the first measurement data of the frequency characteristic of a sound signal of the earphone 101 in the frequency band of equal to or lower than about 800 Hz, and the second measurement data of the frequency characteristic of the sound signal of the earphone 101 in the frequency band of higher than about 800 Hz so as to generate measurement data of a frequency characteristic to be corrected.

The term "about 800 Hz" used in the first embodiment as a reference means a predetermined frequency band. When the first measurement data and the second measurement data are combined with each other, the combining module 316 decreases a ratio of using the first measurement data and increases a ratio of using the second measurement data, as the frequency increases in the predetermined frequency band.

In the embodiment, the predetermined frequency band is set between 600 Hz and 900 Hz. The combining module 316 combines the first measurement data and the second measurement data in the frequency band while continuously changing the ratio of the first measurement data and the second measurement data. The change of the ratio can suppress discrepancy to occur at the border of the frequency bands.

As a detailed example, the combining module 316 changes the ratio of the first measurement data as follows: the ratio is 100% in a frequency band of equal to or lower than 600 Hz, the ratio is gradually decreased from 100% to 0% from 600 Hz to 900 Hz, and the ratio is 0% in a frequency band of higher than 900 Hz. The combining module 316 uses the second measurement data in accordance with the remaining ratio.

Figure 12:
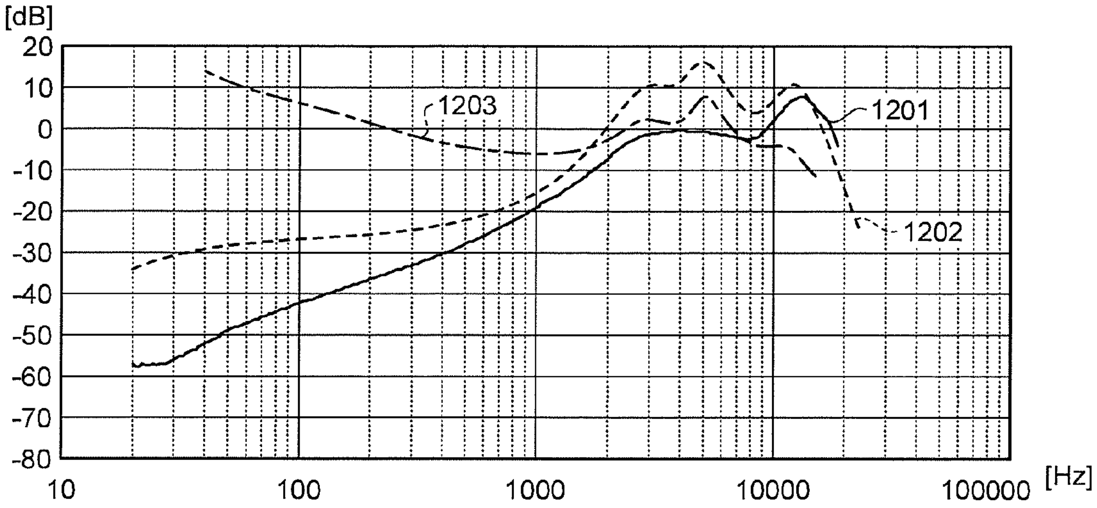
FIG. 12 is an exemplary graph of measurement data combined by a combining module in the first embodiment.

FIG. 12 is a graph illustrating an example of measurement data combined by the combining module 316. The example of FIG. 12 illustrates measurement data 1201 of the earphone 101 after the combination, measurement data 1202 of the high-quality sound earphone after the combination, and difference data 1203 in which an offset is added to a difference between the measurement data 1201 of the earphone 101 and the measurement data 1202 of the high-quality sound earphone. It can be seen that the difference data 1203 of FIG. 12 approximately coincides with the difference data 503 obtained from the data measured by using the jig. As described above, the PC 100 according to the embodiment can obtain the same effects as the case where the jig is used by combining frequency characteristics of an earphone set in a plurality of conditions. In the embodiment, data of frequency characteristics, such as a frequency characteristic of the high-quality sound earphone obtained by combining the low frequency band and the high frequency band, is preliminarily stored in the target characteristic storage module 315.

The generator 317 generates correction parameters based on a difference between target frequency characteristic data stored in the target characteristic storage module 315 and measurement data, which is combined by the combining module 316, of the frequency characteristic, which is to be corrected, of the earphone 101. The generator 317 generates the correction parameters so that the combined frequency characteristic of the earphone 101 is approximated to the target frequency characteristic, in relation to sound that is output from the earphone 101 and reaches an eardrum of a user. The correction parameters comprise parameters used in a typical parametric equalizer, for example. The parameters used in the parametric equalizer are a center frequency, a width of a frequency band to be adjusted, and a gain.

The technique generating the correction parameters is not limited to that of the embodiment, i.e., the correction parameters are generated after the combination of measurement data. Any technique may be employed as long as the technique can generate the correction parameters that correct the combined frequency characteristic of the earphone 101 so as to be the target frequency characteristic by the following manner: the generator 317 uses, in a frequency band of equal to or lower than a reference, data indicating the frequency characteristic of a sound signal measured in the state in which the earphone 101 and the microphone 213 are brought close in contact with each other, and uses, in a frequency band of higher than the reference, data indicating the frequency characteristic of a sound signal measured in the state in which a gap is provided between the earphone 101 and the microphone 213.

The setting module 318 sets the correction parameters produced by the generator 317 to the correction filter 321.

Measurement variance in acquiring the second measurement data in the state in which a gap is provided between the earphone 101 and the microphone 213 is described below. One of the techniques to provide a gap between the earphone 101 and the microphone 213 is illustrated in FIG. 8 in which one side of the ear chip of the earphone 101 is brought in contact with the cabinet 601 as well as a proper angle is kept with respect to the cabinet 601. The use of the technique can suppress a distance between the earphone 101 and the microphone 213 from varying without using the jig and the like. However, it can be easily understood that it is difficult to perform measurement while a user accurately holds the angle, even though the display controller 323 displays a display urging the user to hold the earphone 101 at an angle of 45 degrees with respect to the cabinet 601, and measurement to be performed, for example.

Figure 13:
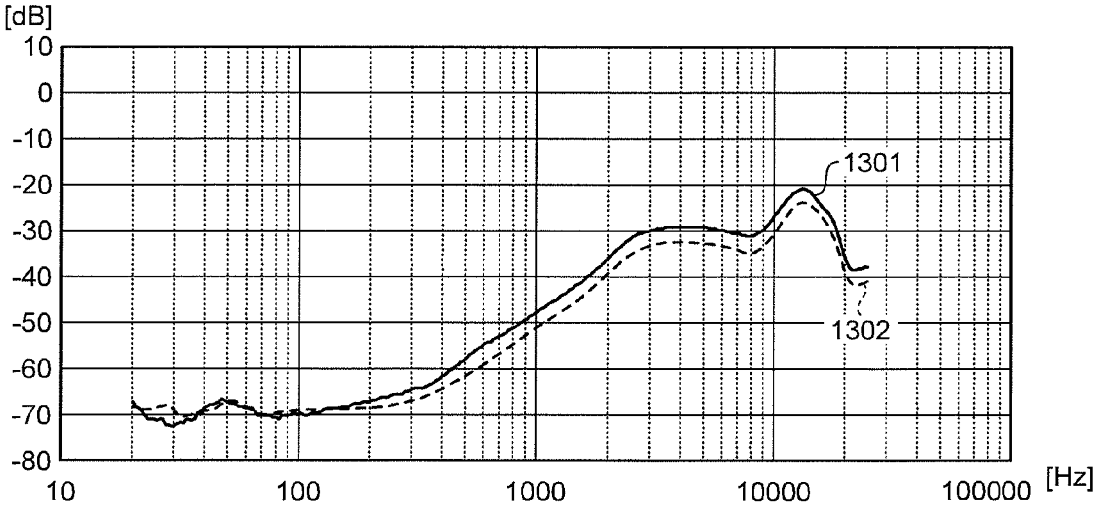
FIG. 13 is an exemplary graph of measurement data of when an attachment angle of the earphone with respect to a cabinet, i.e., a size of a gap, is changed, in the first embodiment.

FIG. 13 is a graph illustrating an example of measurement data when the angle between the earphone 101 and the cabinet 601, i.e., a size of a gap, is changed. The example of FIG. 13 illustrates two measurement results based on different gap sizes obtained by changing the attachment angle of the earphone 101 with respect to the cabinet 601. With the comparison between a measurement result 1301 of a small gap and a measurement result 1302 of a large gap, it can be seen that both characteristic curves have shapes that are very similar to each other while both characteristic curves differ in a sound pressure level based on the difference in the attachment angle. Accordingly, the difference based on the difference in the gap size can be suppressed by normalizing the level of the second measurement data with respect to the level of the first measurement data when the combining module 316 performs combining.

The combining module 316 according to the first embodiment shifts (normalizes) the level of the second measurement data so that a difference between an average level of the first measurement data and an average level of the second measurement data in a frequency band of from 600 Hz to 900 Hz, which is a reference for combining, is to be a fixed value. In the embodiment, the fixed value is set as zero dB. The fixed value, however, is not limited to zero dB, and any value may be set.

Specifically, the combining module 316 normalizes the second measurement data with an offset amount of 28.3 dB for the measurement result 1301 of a small gap. The combining module 316 normalizes the second measurement data with an offset amount of 32.4 dB for the measurement result 1302 of a large gap. Both measurement data allows the measurement data 1201 of the earphone 101 illustrated in FIG. 12 to be obtained as the combination result. Although description thereof is omitted, the measurement data of the high-quality sound earphone stored in the target characteristic storage module 315 is also normalized in the same manner as described above when combined.

A sound pressure level measured in the state in which a gap is provided between the earphone 101 and the microphone 213 is smaller than that measured in the state in which the earphone 101 and the microphone 213 are brought close in contact with each other. The PC 100 according to the embodiment, thus, adjusts at least one of a sound volume of a sound signal output by the sound signal output module 322 through the earphone 101 and sensitivity of the microphone 213, through which the input module 311 receives a sound signal to be processed, so as to be larger when a sound signal is measured in the gap state (the second measurement data is received and processed) than when a sound signal is measured in the close contact state (the first measurement data is received and processed). Even if measurement is performed by changing a volume of a sound output from the earphone 101, no combination result theoretically varies because of the same reasons as described above. As a result of the adjustment, measurement in the gap state can be performed with high accuracy because it is hardly affected by surrounding noises.

Figure 14:
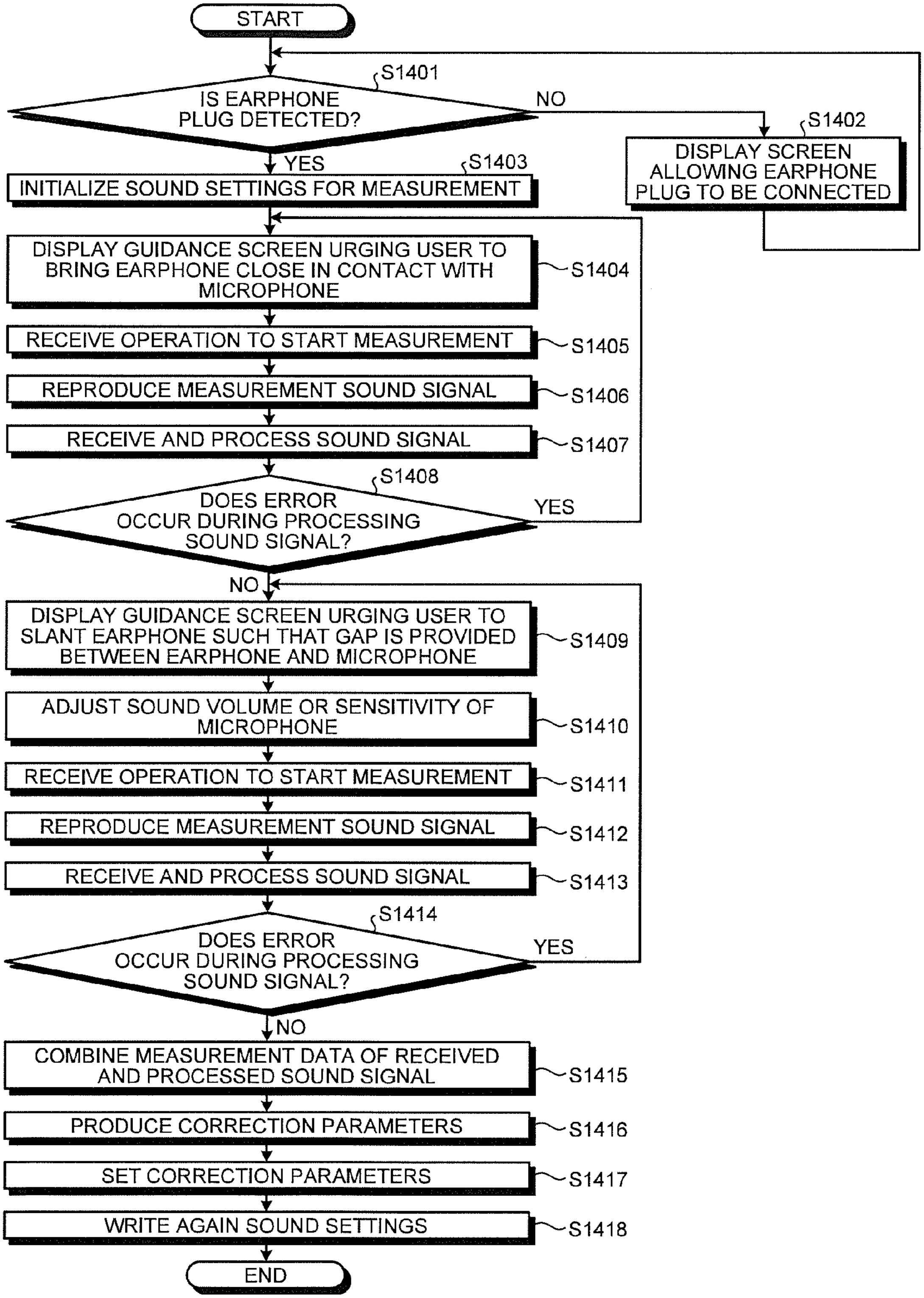
FIG. 14 is an exemplary flowchart of setting process of a correction filter in the PC, in the first embodiment.

Setting processing of the correction filter in the PC 100 according to the embodiment is described below. FIG. 14 is a flowchart of the processing in the PC 100 according to the first embodiment.

The media player 222 detects whether the earphone 101 is connected to the output terminal 214 (S1401). If it is detected that the earphone 101 is not connected to the output terminal 214 (No at S1401), the display controller 323 displays a display urging a user to connect the earphone 101 to the output terminal 214 (S1402), and the media player 222 detects again whether the earphone 101 is connected to the output terminal 214 (S1401).

On the other hand, if the media player 222 detects that the earphone 101 is connected to the output terminal 214 (Yes at S1401), the setting module 318 of the correction filter design module 314 sets the correction filter 321 so as not to perform correction, and initializes the sound settings for measurement (S1403).

The display controller 323 displays a guidance display urging a user to hold the earphone 101 such that the earphone 101 is brought close in contact with the microphone 213 (S1404). An example of the guidance display is the screen illustrated in FIG. 10.

After the user holds the earphone 101 such that the earphone 101 is brought close in contact with the microphone 213, operation to start measurement is performed. The operation receiver 324 receives the operation to start measurement from the user (S1405). Then, the sound signal output module 322 reads a measurement sound signal from the measurement signal storage module 325, and reproduces (outputs) the sound signal from the earphone 101 (S1406).

Then, the input module 311 receives the sound signal through the microphone 213, and processes the sound signal (S1407). The measurement module 312 generates the first measurement data indicating the frequency characteristic of the sound signal based on the sound signal received from the input module 311. The measurement module 312 determines whether error occurs during the generation of the first measurement data (S1408). If it is determined that the error occurs (Yes at S1408), the procedure returns to S1404 to start processing from S1404 for re-measurement.

On the other hand, if determining that no error occurs (No at S1408), the measurement module 312 stores the generated first measurement data in the signal temporary storage module 313. Thereafter, the display controller 323 displays a guidance display urging the user to slant and hold the earphone 101 such that a gap is provided between the earphone 101 and the microphone 213 (S1409). An example of the guidance display is the screen illustrated in FIG. 11.

Then, in order to achieve high accuracy measurement in the gap state, an adjustment is performed such that a sound volume of a sound signal output by the sound signal output module 322 through the earphone 101 is increased, or such that sensitivity of the microphone 213 through which the input module 311 receives a sound signal to be processed is increased (S1410). The adjustment is not limited to be performed on only one item. The adjustment may be performed on both of the sound volume and the sensitivity.

Then, after the user slants and holds the earphone 101 so as to provide a gap between the earphone 101 and the microphone 213, operation to start measurement is performed. The operation receiver 324 receives the operation to start measurement from the user (S1411). Then, the sound signal output module 322 reads a measurement sound signal from the measurement signal storage module 325, and reproduces (outputs) the sound signal from the earphone 101 (S1412).

Then, the input module 311 receives the sound signal through the microphone 213, and processes the sound signal (S1413). The measurement module 312 produces the second measurement data indicating the frequency characteristic of the sound signal based on the sound signal received from the input module 311. The measurement module 312 determines whether error occurs during the generation of the second measurement data (S1414). If it is determined that error occurs (Yes at S1414), the procedure returns to S1409 to start processing from S1409 for re-measurement.

On the other hand, if determining that no error occurs (No at S1414), the measurement module 312 stores the generated second measurement data in the signal temporary storage module 313. Thereafter, the combining module 316 combines measurement data of the received and processed sound signal (S1415). Specifically, the combining module 316 reads the first measurement data and the second measurement data stored in the signal temporary storage module 313, and combines two pieces of measurement data by using the above-described technique.

The generator 317 generates correction parameters based on a difference between target frequency characteristic data stored in the target characteristic storage module 315, and measurement data, which is combined by the combining module 316, of the frequency characteristic, which is to be corrected, of the earphone 101 (S1416).

Then, the setting module 318 sets the correction parameters generated by the generator 317 to the correction filter 321 (S1417). The setting module 318 writes again the sound settings initialized at S1403 except the correction parameters (S1418).

Through the above-described processing procedure with PC, a correction filter suitable for the earphone 101 is designed. The sound quality of the earphone 101 is changed to the sound quality of the high-quality sound earphone or sound quality according to user's preference.

In the embodiment, first, measurement is performed in the state in which the earphone 101 and the microphone 213 are brought close in contact with each other, and thereafter measurement is performed in the state in which a gap is provided between the earphone 101 and the microphone 213. The order may be reversed, i.e., first, measurement is performed in the state in which a gap is provided between the earphone 101 and the microphone 213, and thereafter the measurement is performed in the state in which the earphone 101 and the microphone 213 are made close contact with each other.

In the embodiment, the frequency characteristic of an earphone that a user uses is adjusted so as to be approximated to the frequency characteristic of a high-quality sound earphone as a reference. The target frequency characteristic is not limited to that of the actual product such as the high-quality sound earphone. Any target frequency characteristic may be produced as the target obtained by changing the frequency characteristic of the user's earphone.

In the embodiment, about 800 Hz (a frequency band from 600 Hz to 900 Hz) is used as the reference. However, such reference varies for different embodiments. Thus, the reference may suitable be set through experiments and the like, according to different embodiments.

As described above, the PC 100 according to the embodiment enables the frequency characteristic of an earphone to be easily measured without using an expensive measuring device and special equipment such as a jig. As a result, the frequency characteristic of the earphone can be corrected so as to be a frequency characteristic suitable for the earphone.

In the first embodiment, the frequency characteristic of the high-quality sound earphone is stored in the target characteristic storage module 315, as a target. However, a user may prepare any earphone as the target. In this case, correction can be performed by measuring the frequency characteristics of the targeted earphone and an earphone to be corrected in the close contact state and the gap state.

In the first embodiment, the PC 100 reproduces audio data by using the correction filter 321. The reproduction of audio data is not limited to be preformed by the PC 100 as described in the first embodiment. In a second embodiment, correction is performed by an audio reproduction device that is not included in the PC.

Figure 15:
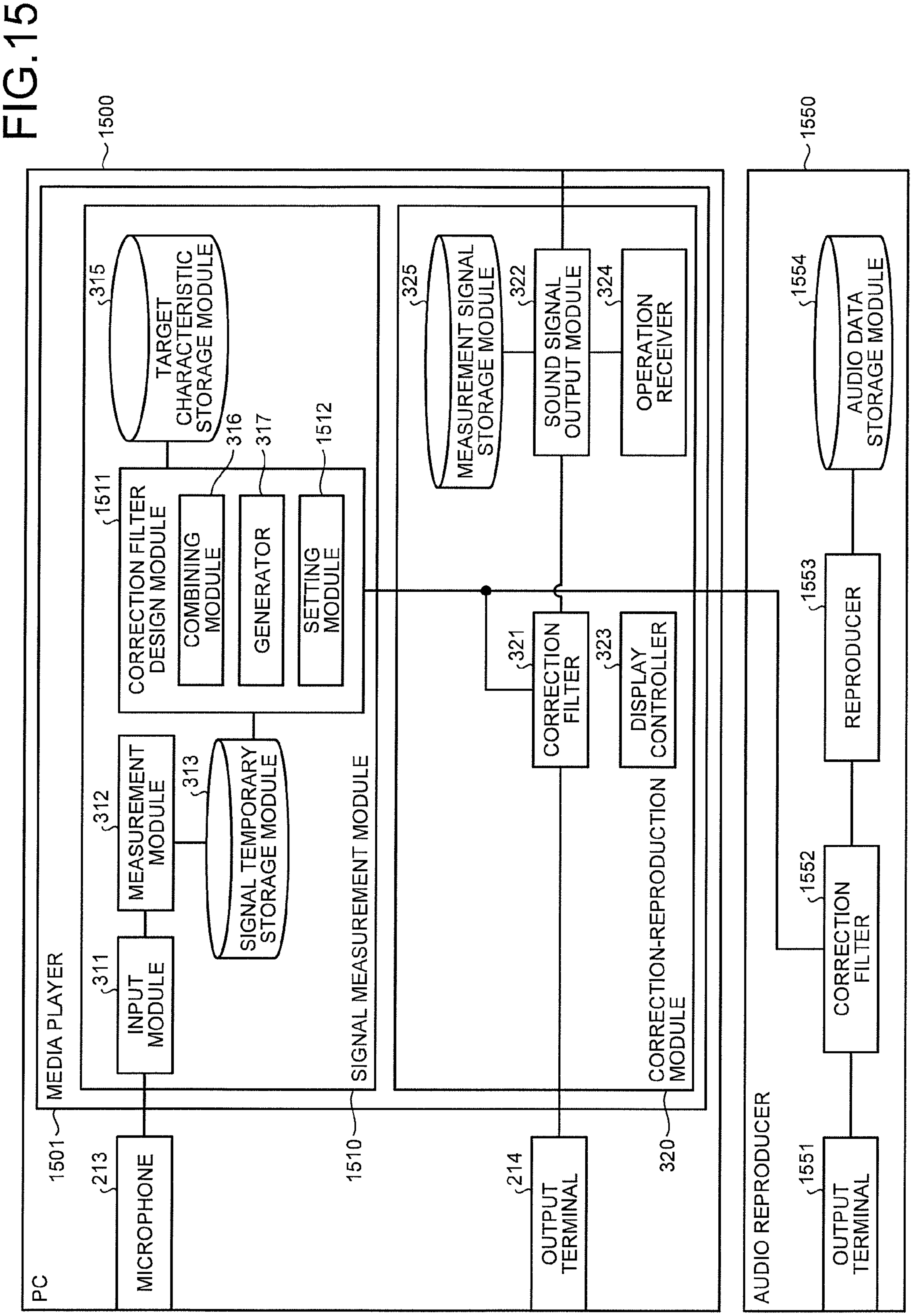
FIG. 15 is an exemplary block diagram of a software configuration of a media player of a PC and an audio reproduction device, according to a second embodiment.

FIG. 15 is an exemplary block diagram of a software configuration of a media player 1501 of a PC 1500 and an audio reproduction device 1550 according to a second embodiment.

The audio reproduction device 1550 comprises an output terminal 1551, a correction filter 1552, a reproducer 1553, and an audio data storage module 1554. The output terminal 1551 is connectable to the earphone 101.

The audio data storage module 1554 stores therein audio data to be reproduced. The reproducer 1553 reads audio data from the audio data storage module 1554, and reproduces the audio data.

The correction filter 1552 corrects an audio signal reproduced by the reproducer 1553 from the audio data. The correction parameters used for correction performed by the correction filter 1552 are set by the PC 1500. The audio signal corrected by the correction filter 1552 is output from the earphone 101 through the output terminal 1551.

The media player 1501 of the PC 1500 comprises a signal measurement module 1510 that performs different processing from that of the signal measurement module 310 of the first embodiment.

The signal measurement module 1510 differs from the signal measurement module 310 of the first embodiment in that the setting module 318 is replaced with a setting module 1512 that performs different processing from that of the setting module 318 in a correction filter design module 1511.

The setting module 1512 sets the correction parameters produced by the generator 317 to the correction filter 1552 of the audio reproduction device 1550.

With the configuration of the second embodiment, the audio reproduction device 1550, which though does not generate the correction parameters, can correct the frequency characteristic of a connected earphone so as to be a frequency characteristic suitable for the earphone.

In the second embodiment, the audio reproduction device 1550 is provided with the correction filter 1552. In a third embodiment, the audio reproduction device is provided with no correction filter.

Figure 16:
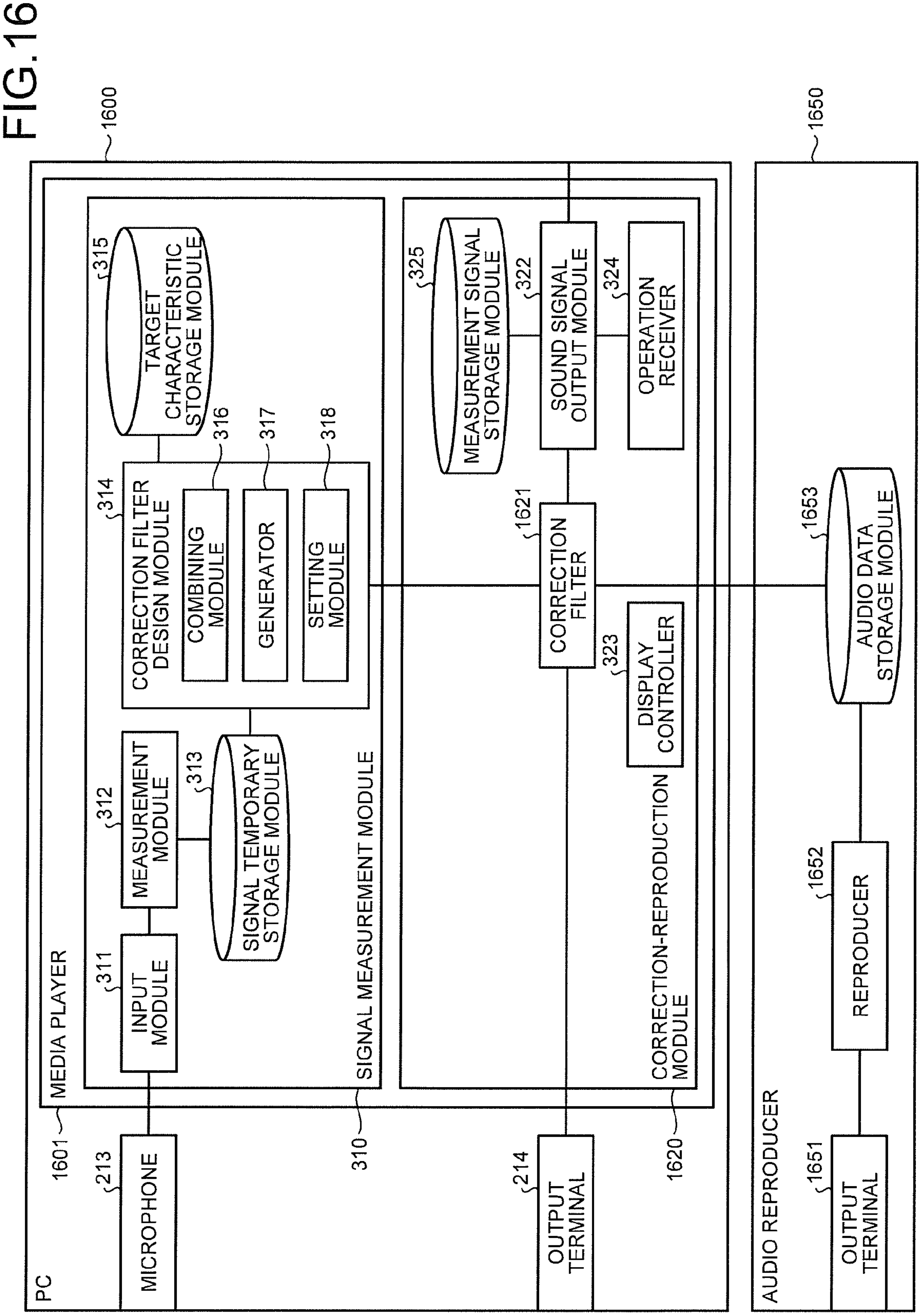
FIG. 16 is an exemplary block diagram of a software configuration of a media player of a PC and an audio reproduction device, according to a third embodiment.

FIG. 16 is an exemplary block diagram of a software configuration of a media player 1601 of a PC 1600 and an audio reproduction device 1650 according to the third embodiment.

The audio reproduction device 1650 comprises an output terminal 1651, a reproducer 1652, and an audio data storage module 1653. The output terminal 1651 is connectable with an earphone.

The audio data storage module 1653 stores therein audio data to be reproduced. The reproducer 1652 reads audio data from the audio data storage module 1653, and reproduces the audio data.

The media player 1601 of the PC 1600 comprises a correction-reproduction module 1620 that performs different processing from that of the correction-reproduction module 320 of the first embodiment.

Audio data is corrected by a correction filter 1621 of the correction-reproduction module 1620, and stored in the audio data storage module 1653 of the audio reproduction device 1650. In this way, the configuration of the third embodiment enables audio data corrected so as to be suitable for a connected earphone to be stored in the audio data storage module 1653.

According to the third embodiment, even the audio reproduction device 1650 comprising no correction filter can obtain an effect of correction suitable for an earphone.

As described above, according to the first to the third embodiments, correction can be appropriately performed corresponding to the frequency characteristic of an earphone.

The media player program executed by the PC of the embodiments is recorded into a computer readable storage medium with a format installable in or a file executable by a computer, and provided. The examples of the storage medium comprise a compact disk ROM (CD-ROM), a flexible disk (FD), a CD-recordable (CD-R), and a digital versatile disk (DVD).

The media player program executed by the PC of the embodiments may be stored in a computer coupled with a network such as the Internet, and be provided by being downloaded through the network. The media player program executed by the PC of the embodiments may be provided or delivered through a network such as the Internet.

The media player program executed by the PC of the embodiments may be provided by being preliminarily stored in the ROM, for example.

The media player program executed by the PC of the embodiments has a module structure comprising the above-described modules (signal measurement module and correction-reproduction module). In actual hardware, the CPU (processor) reads the media player program from the recording medium and executes the media player program. Once the media player program is executed, the modules are loaded into a main storage, so that the signal measurement module and the correction-reproduction module are formed in the main storage.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sound signal processor comprising:

a connector configured to be connectable with an earphone;

an input module configured to receive and process a first sound signal and a second sound signal as a plurality of sound signals corresponding to sound of a plurality of times output from the earphone, respectively, the first sound signal corresponding to a state in which the earphone is in close contact with a microphone, the second sound signal corresponding to a state in which a gap is provided between the earphone and the microphone; and a generator configured to generate, based on a target frequency characteristic and a combined frequency characteristic, correction data correcting a frequency characteristic of the earphone, the target frequency characteristic being set as a target, the combined frequency characteristic being a combination of first data and second data, the first data indicating a frequency characteristic of the first sound signal within a first frequency band lower than or equal to a reference, the second data indicating a frequency characteristic of the second sound signal within a second frequency band higher than the reference.

2. The sound signal processor of claim 1, further comprising a combining module configured to combine the first data and the second data, wherein the generator is configured to generate the correction data based on a difference between the target frequency characteristic and the combined frequency characteristic.

3. The sound signal processor of claim 2, wherein the reference is a predetermined frequency band, and, the combining module is configured to combine the first data and the second data while a ratio of using the first data decreases and a ratio of using the second data increases as a frequency increases.

4. The sound signal processor of claim 2, wherein, upon combining the first data and the second data by the combining module, the second data is normalized so that a difference between the frequency characteristic indicated by the first data and the frequency characteristic indicated by the second data is to be a fixed value within a frequency band serving as the reference.

5. The sound signal processor of claim 1, wherein the input module is configured to receive and process the sound signals through the microphone, and the sound signal processor further comprising:

an output module configured to output the sound from the earphone the plurality of times; and a display module configured to display a screen urging a user to bring the earphone close in contact with the microphone before a first sound among the sound of the plurality of times is output by the output module, and to display a screen urging the user to provide a gap between the earphone and the microphone before a second sound among the sound of the plurality of times is output by the output module.

6. The sound signal processor of claim 1, further comprising:

an output module configured to output the sound from the earphone the plurality of times, wherein, upon receiving and processing the second sound signal by the input module, sensitivity of the microphone through which the sound signals pass upon the receiving and processing is increased or level of the sound output by the output module is increased, compared to when the input module receives the first sound signal.

7. The sound signal processor of claim 1, wherein the input module is configured to receive and process the sound signals through the microphone, and the sound signal processor further comprising:

an output module configured to output the sound from the earphone the plurality of times; and a display module configured to display a screen urging a user to provide a gap between the earphone and the microphone before a first sound among the sound of the plurality of times is output by the output module, and to display a screen urging the user to bring the earphone close in contact with the microphone before a second sound among the sound of the plurality of times is output by the output module.

8. The sound signal processor of claim 1, further comprising an output module configured to output the sound from the earphone the plurality of times, wherein, upon receiving and processing the first sound signal by the input module, sensitivity of the microphone through which the sound signals pass upon the receiving and processing is decreased or level of the sound output by the output module is decreased, compared to when the input module receives the second sound signal.

9. The sound signal processor of claim 1, further comprising a correction module configured to correct a sound signal by using the correction data generated by the generator.

10. The sound signal processor of claim 1, further comprising an output module configured to output the correction data generated by the generator to a sound signal reproduction device.

11. A sound signal processing method performed by a sound signal processor comprising a connector configured to be connectable with an earphone, the method comprising:

receiving and processing, by an input module, a first sound signal and a second sound signal as a plurality of sound signals corresponding to sound of a plurality of times output from the earphone, respectively, the first sound signal corresponding to a state in which the earphone is in close contact with a microphone, the second sound signal corresponding to a state in which a gap is provided between the earphone and the microphone; and generating, by a generator, based on a target frequency characteristic and a combined frequency characteristic, correction data correcting a frequency characteristic of the earphone, the target frequency characteristic being set as a target, the combined frequency characteristic being a combination of first data and second data, the first data indicating a frequency characteristic of the first sound signal within a first frequency band lower than or equal to a reference, the second data indicating a frequency characteristic of the second sound signal within a second frequency band higher than the reference.

12. The sound signal processing method of claim 11, further comprising combining, by a combining module, the first data and the second data, wherein the generating comprises generating the correction data based on a difference between the target frequency characteristic and the combined frequency characteristic.

13. The sound signal processing method of claim 12, wherein the reference is a predetermined frequency band, and, the combining comprises combining the first data and the second data while a ratio of using the first data decreases and a ratio of using the second data increases as a frequency increases.

14. The sound signal processing method of claim 12, wherein, upon combining the first data and the second data by the combining module, the second data is normalized so that a difference between the frequency characteristic indicated by the first data and the frequency characteristic indicated by the second data is to be a fixed value within a frequency band serving as the reference.

15. The sound signal processing method of claim 11, wherein the receiving and processing comprises receiving and processing the sound signals through the microphone, and the sound signal processing method further comprising:

outputting, by an output module, the sound from the earphone the plurality of times; and displaying, by a display module, a screen urging a user to bring the earphone close in contact with the microphone before a first sound among the sound of the plurality of times is output by the output module, and to display a screen urging the user to provide a gap between the earphone and the microphone before a second sound among the sound of the plurality of times is output by the output module.

16. The sound signal processing method of claim 11, further comprising:

outputting, by an output module, the sound from the earphone the plurality of times, wherein, upon receiving and processing the second sound signal by the input module, sensitivity of the microphone through which the sound signals pass upon the receiving and processing is increased or level of the sound output by the output module is increased, compared to when the input module receives the first sound signal.

17. The sound signal processing method of claim 11, wherein the receiving and processing comprises receiving and processing the sound signals through the microphone, and the sound signal processing method further comprising:

outputting, by an output module, the sound from the earphone the plurality of times; and displaying, by a display module, a screen urging a user to provide a gap between the earphone and the microphone before a first sound among the sound of the plurality of times is output by the output module, and to display a screen urging the user to bring the earphone close in contact with the microphone before a second sound among the sound of the plurality of times is output by the output module.

18. The sound signal processing method of claim 11, further comprising outputting, by an output module, the sound from the earphone the plurality of times, wherein, upon receiving and processing the first sound signal by the input module, sensitivity of the microphone through which the sound signals pass upon the receiving and processing is decreased or level of the sound output by the output module is decreased, compared to when the input module receives the second sound signal.

19. The sound signal processing method of claim 11, further comprising correcting, by a correction module, a sound signal by using the correction data generated by the generator.

20. The sound signal processing method of claim 11, further comprising outputting, by an output module, the correction data generated by the generator to a sound signal reproduction device.

* * * * *